United States Patent [19]

Hingorani et al.

[11] Patent Number: 5,215,599
[45] Date of Patent: Jun. 1, 1993

[54] ADVANCED SOLAR CELL

[75] Inventors: Narain G. Hingorani, Los Altos Hills; Harshad Mehta, Cupertino, both of Calif.

[73] Assignee: Electric Power Research Institute, Palo Alto, Calif.

[21] Appl. No.: 695,612

[22] Filed: May 3, 1991

[51] Int. Cl.$^5$ .............................................. H01L 31/06
[52] U.S. Cl. ..................................... 136/255; 257/431
[58] Field of Search .............. 136/255; 357/30 A, 30 J

[56] References Cited

U.S. PATENT DOCUMENTS

| | | | |
|---|---|---|---|
| 3,928,073 | 12/1975 | Besson et al. | |
| 4,628,144 | 12/1986 | Burger | 136/256 |
| 4,694,115 | 9/1987 | Lillington et al. | 136/256 |
| 4,695,935 | 9/1987 | Oen et al. | 363/21 |
| 4,703,553 | 11/1987 | Mardesich | 437/2 |
| 4,758,525 | 7/1988 | Kida et al. | 437/2 |
| 4,773,945 | 9/1988 | Woolk et al. | 136/256 |
| 4,774,193 | 9/1988 | Juergens | 437/4 |
| 4,792,749 | 12/1988 | Kitagawa et al. | 323/314 |
| 4,804,866 | 2/1989 | Akiyama | 307/311 |
| 4,828,628 | 5/1989 | Hezel et al. | 136/255 |
| 4,836,861 | 6/1989 | Peltzer et al. | 136/246 |
| 4,873,202 | 10/1989 | Akiyama | 437/62 |
| 4,900,369 | 2/1990 | Hezel et al. | 136/255 |

FOREIGN PATENT DOCUMENTS 58-98987  6/1983  Japan .................................. 136/255

Primary Examiner—Aaron Weisstuch
Attorney, Agent, or Firm—Klarquist, Sparkman, Campbell, Leigh & Whinston

[57] ABSTRACT

An advanced solar cell having an improved efficiency over known conventional solar cells uses an external electric field to enhance the conversion of solar energy into electrical energy. The advanced solar cell has a layered extrinsic semiconductor with a lightly doped base layer sandwiched between two oppositely and heavily doped layers to form a P-N junction within the semiconductor. The base layer has opposing incident and collection surfaces, at least one of which has recessed contact regions interspersed between biasing regions. At least one of the heavily doped layers is substantially confined within the recessed contact regions. Overlaying the biasing region is an enhancement layer, such as a layered MOS structure. Biasing the enhancement layer provides an externally generated electric field to the semiconductor which enhances a depletion region formed around the P-N junction when photon radiation impinges on the semiconductor. A transparent layer of a conductive material may overlay one of the heavily doped layers or comprise a portion of the MOS structure. A method is also provided of converting solar energy into electrical energy.

20 Claims, 4 Drawing Sheets

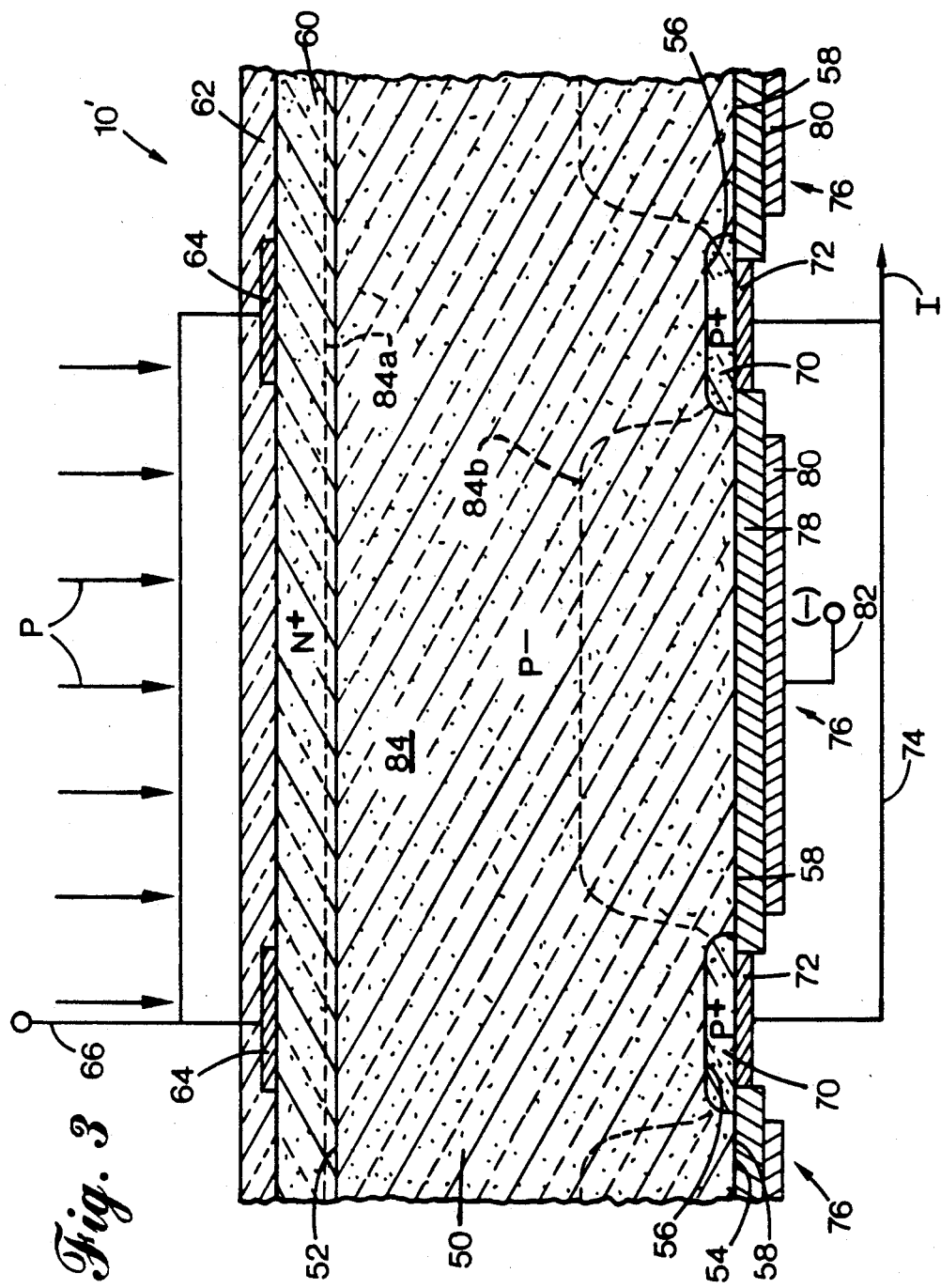

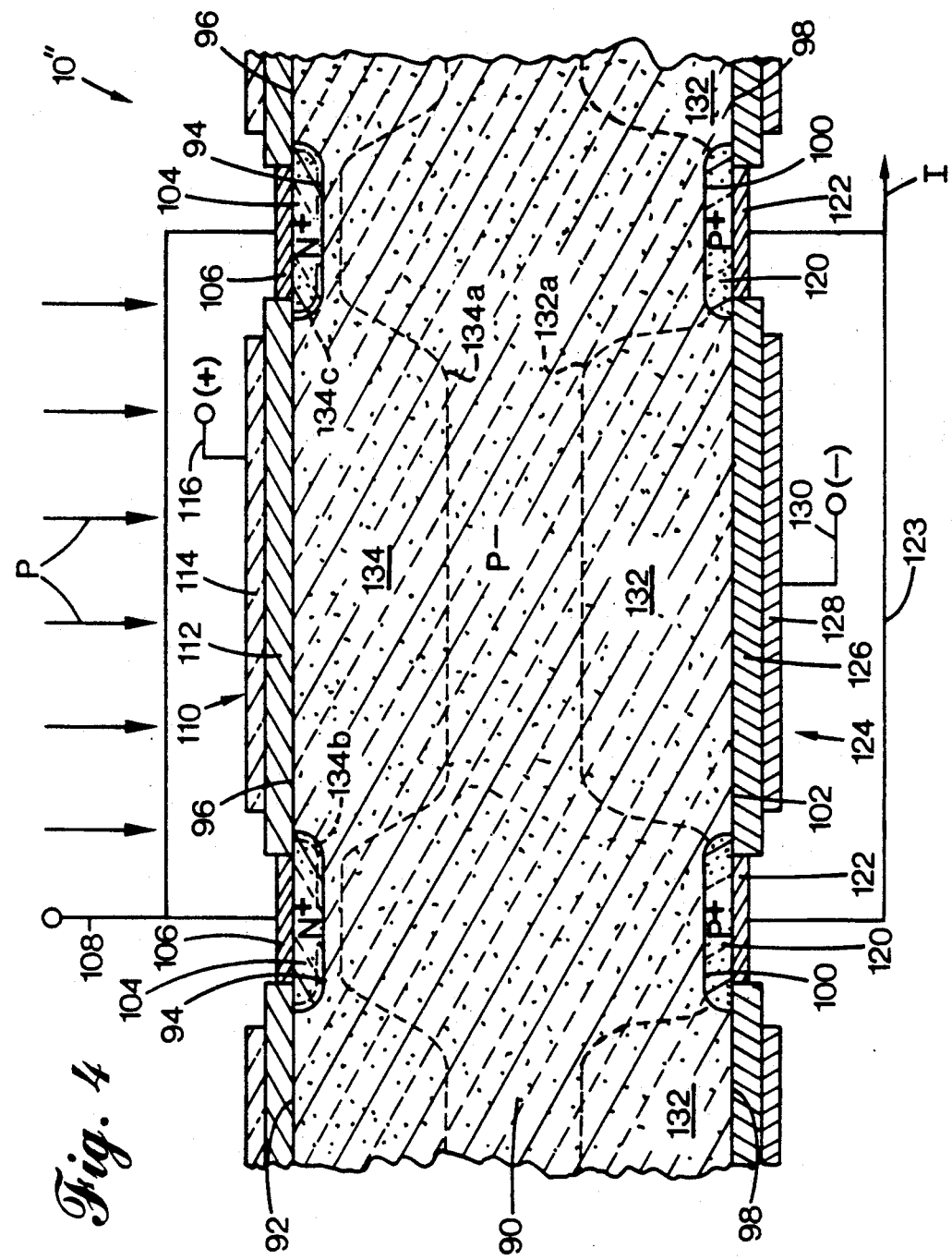

ADVANCED SOLAR CELL

BACKGROUND OF THE INVENTION

The present invention relates generally to photovoltaic cells, and more particularly to an improved solar cell which may be used to more efficiently transform solar energy into electrical energy.

A variety of photovoltaic cells, solar cells, and related devices have been proposed. For example, one conventional solar cell structure, used to convert solar photon radiation into electric current, comprises a layered extrinsic semiconductor. The conventional solar cell operates by converting incident photon radiation into electron-hole pairs within the semiconductor. These electron-hole pairs are then collected and separated at a P-N junction within the semiconductor to provide the electrical current produced by the solar cell.

In a conventional solar cell, the semiconductor has opposing incident and collection sides, with the incident side of the cell receiving the photon radiation. The semiconductor has a strongly doped (i.e., designated impurities have been added to a pure semiconductor material) negative conduction type or N-type layer (hereinafter designated an $N^+$) lying adjacent the incident side. The $N^+$ region serves as a cathode for the solar cell. An anti-reflection (AR) coating is applied over the $N^+$ region. A strongly doped positive or P-type layer (hereinafter designated as $P^+$) lies adjacent the collection side of the cell. The $P^+$ region serves as an anode for the solar cell. The semiconductor also has a lightly doped base layer which is slightly positive conduction type or P-type (hereinafter designated as $P^{(-)}$), sandwiched between the $P^+$ and $N^+$ layers. Due to the longer diffusion length for electrons in silicon, the most commonly used silicon solar cell has this complementary $N^+P^{(-)}P^+$ cell structure. This layering of oppositely doped layers forms a P-N junction within the solar cell.

When the conventional solar cell is exposed to a light source, such as the sun, the impinging photons create electron-hole pairs in the semiconductor, with the electron portion comprising a negative charge carrier and the hole portion comprising a positive charge carrier. The impinging photons also cause a depletion region to be formed across the P-N junction, with the number of positive and negative charge carriers within the depletion region being substantially equal. All of the carriers created in the depletion region contribute to the photo-current output.

For carriers created in the $N^+$ region near the incident side to contribute to the photo-current output, they must diffuse through the thickness of the $N^+$ layer to reach the P-N junction. However, due to surface recombination, some of the carriers recombine with atoms in the lattice of the $N^+$ region prior to reaching the P-N junction. Thus, these recombined carriers do not contribute to the solar cell current, resulting in a loss of solar cell efficiency.

For carriers created deep in the bulk of the $P^{(-)}$ base region to contribute to the photo-current, these carriers must diffuse and travel to the edge of the depletion region. However, the width of the depletion region extending into the $P^{(-)}$ base layer is relatively small, basically due to the small bias across the P-N junction. During this travel, the carriers recombine with atoms in the lattice of the $P^{(-)}$ base layer, which results in a further loss of efficiency. Furthermore, the loss of carriers in the $P^{(-)}$ region can be severe if the carrier lifetime, that is, the length of time before recombination occurs, is reduced.

Thus, the collection of the photo-current forming electron-hole pairs at the P-N junction takes place in three ways: (1) by the generation of electron-hole pairs in the depletion region surrounding the P-N junction; (2) by the diffusion of minority carriers in the heavily doped $N^+$ layer adjacent the P-N junction; and (3) by the diffusion of minority carriers in the lightly doped $P^{(-)}$ base layer.

In the conventional solar cell, all of the electron-hole pairs generated in the depletion region (item 1 above) are collected by the P-N junction, and thus contribute to the photo-current generated by the cell. However, only a fraction of the hole-electron pairs generated in the lightly doped $P^{(-)}$ base layer (item 3 above) are able to actually diffuse to the P-N junction. This recombination of carriers in the $P^{(-)}$ base region causes a loss of spectral response at lower photon energies, resulting in an overall decrease in the output voltage of the solar cell.

Additionally, the conventional solar cell suffers a reduced spectral response at higher photon energies. This results from a loss of carriers generated in the $N^+$ region (item 2 above) when the incident photons have high energies. The carriers are lost due to recombination of some of the generated carriers within the $N^+$ region. Furthermore, for silicon solar cells, there is zero spectral response at photon energies of less than 1.1 eV because no carriers can be generated across the band gap of the cell when the photon energy falls below this value.

Thus, the conventional layered extrinsic semiconductor solar cell structure suffers a variety of disadvantages. Therefore, a need exists for an improved solar cell for converting solar or photon energy into electrical energy, such as electric current, which is directed toward overcoming, and not being susceptible to, the above limitations and disadvantages.

SUMMARY OF THE INVENTION

According to one aspect of the present invention, a photovoltaic cell has a layered extrinsic semiconductor. The semiconductor has a substantially neutral base layer sandwiched between two heavily doped layers having opposite conductivity types form a P-N junction within the semiconductor. The cell also includes means for applying an externally generated electric field to the semiconductor to enhance a depletion region formed around the P-N junction when photon radiation impinges on the semiconductor.

According to another aspect of the present invention, a solar cell is provided with a lightly doped base layer of a semiconductor material in which solar energy generates charge carriers. The base layer is of a first conduction type and has opposing incident and collection surface, with at least one of the incident and collection surfaces having a contact region and a biasing region. A heavily doped collection layer of the first conductivity type lies adjacent to the base layer collection surface. A heavily doped incident layer of a second conductivity type, which is opposite to the first conductivity type, lies adjacent the base layer collection surface. At least one of the collection and incident layers is substantially confined to the base layer contact region. The solar cell also has an enhancing layer adjacent the base layer biasing region biased for enhancing movement of charge carriers from the lightly doped base layer to at least one of the heavily doped collection and incident layers.

In an illustrated embodiment, the base layer contact region is recessed relative to the biasing region, and at least one of the collection and incident layers is substantially confined within the recessed contact region. In a further illustrated embodiment, the enhancing layer of the solar cell described above is a layered metal oxide semiconductor (MOS) structure. The MOS structure has a dielectric layer adjacent the base layer biasing region and a conductive layer overlaying the dielectric layer. This conductive layer may be a transparent conductive film, such as a film of a lead tin oxide alloy.

In another illustrated embodiment, the base layer collection surface has the contact and biasing regions. In an alternate embodiment, the base layer incident surface has the contact and biasing regions. In a further alternate embodiment, the base layer incident surface has an incident contact region and an incident biasing region, while the base layer collection surface has a collection contact region and a collection biasing region. The enhancing layer overlying the collection biasing region may comprise a layered MOS structure, a polysilicon gate or an evaporated metal gate.

According to a further aspect of the present invention, a method of converting solar energy into electrical energy is provided. The method includes the step of providing a layered extrinsic semiconductor in which solar energy generates charge carriers. The semiconductor has a substantially neutral base layer sandwiched between two heavily doped layers of opposite conductivity types to form a P-N junction within the semiconductor. In an irradiating step, the semiconductor is irradiated with solar energy in the form of solar photon radiation. In an applying step, an externally generated electric field is applied to the semiconductor to enhance a depletion region formed around the P-N junction when photon radiation impinges on the semiconductor, and to enhance the movement of charge carriers from the base layer to one of the heavily doped layers.

It is an overall object of the present invention to provide an improved solar cell for converting solar or other photon energy into electrical energy.

An additional object of the present invention is to provide an improved solar cell with enhanced stability, reliability and a longer lifetime than earlier known solar cells.

Another object of the present invention is to provide an improved solar cell which suffers minimal recombination-induced degradation.

Still another object of the present invention is to provide a solar cell that is more efficient than earlier known solar cells.

A further object of the present invention is to provide an improved solar cell which may be economically manufactured.

The present invention relates to the above features and objects individually as well as collectively. These and other objects, features and advantages of the present invention will become apparent to those skilled in the art from the following description and drawings.

BRIEF DESCRIPTION OF THE DRAWINGS

FIG. 3 is a partially schematic enlarged vertical sectional view of one form of an alternate solar cell of the present invention; and FIG. 4 is a partially schematic enlarged vertical sectional view of one form of another alternate embodiment of the solar cell of the present invention.

DETAILED DESCRIPTION OF THE PREFERRED EMBODIMENTS

Figure 1:
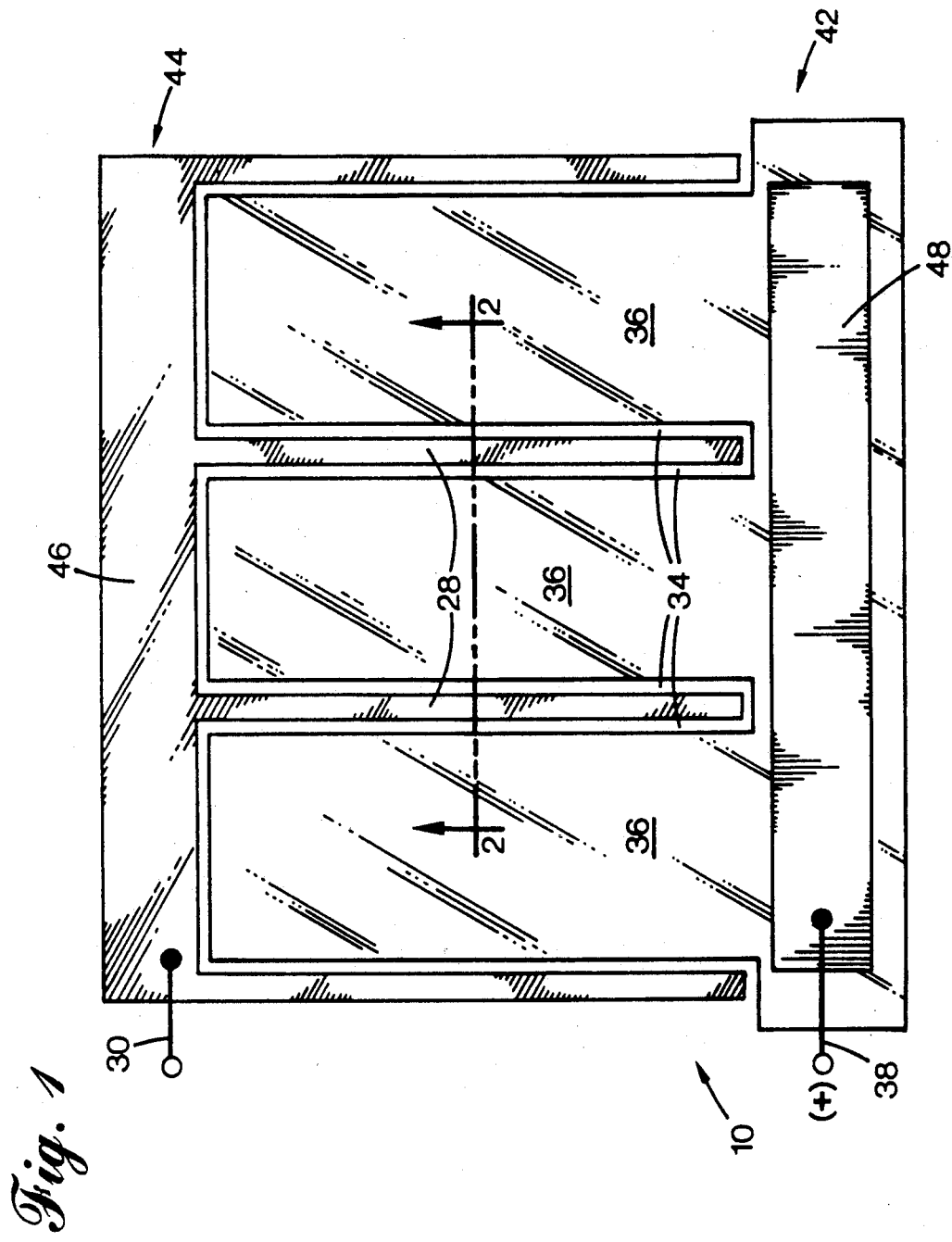
FIG. 1 is a plan view of one form of a solar cell of the present invention.
Figure 2:
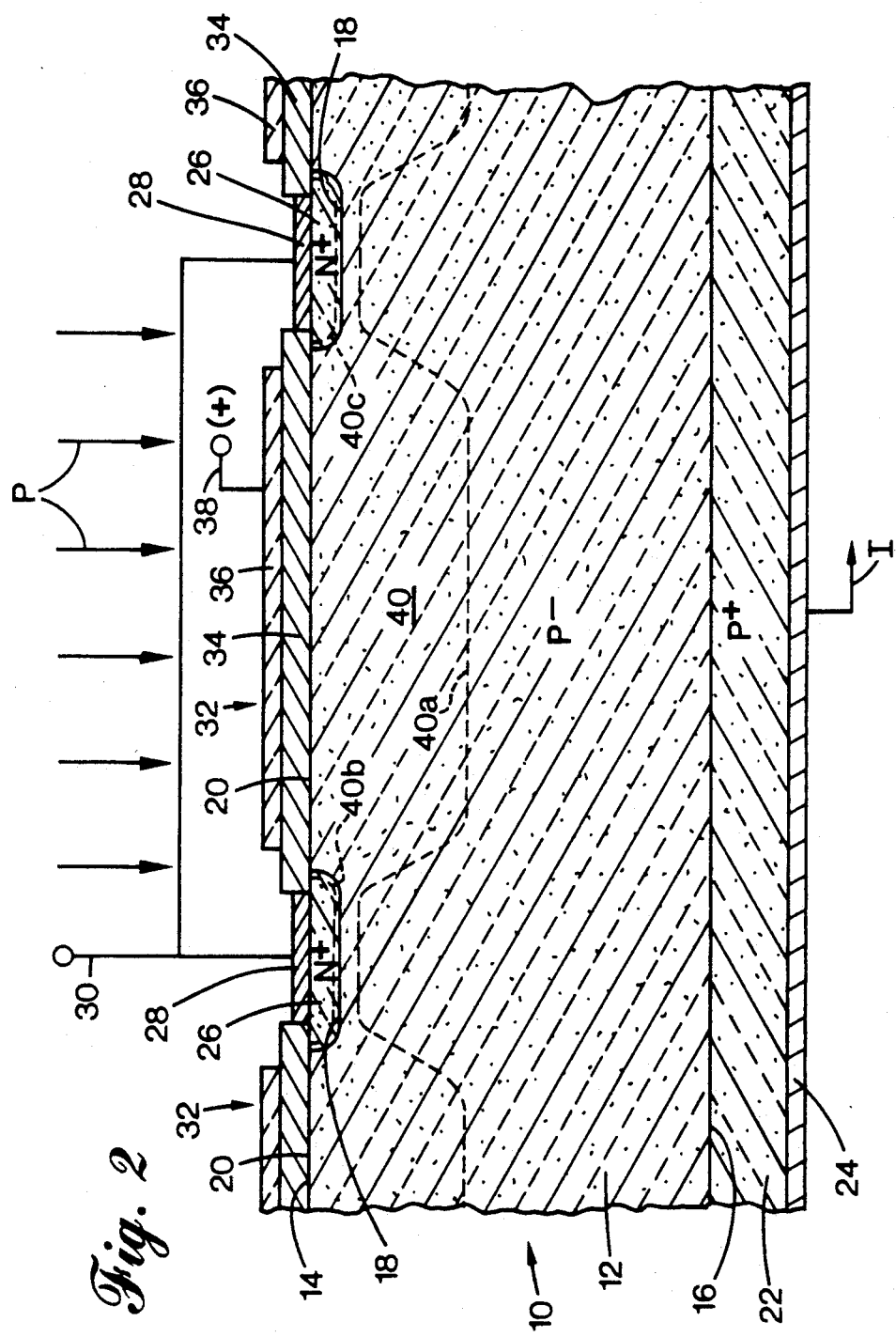
FIG. 2 is a partially schematic enlarged vertical sectional view taken along line 2—2 of FIG. 1.

FIGS. 1 and 2 illustrate an embodiment of an advanced solar cell 10 constructed in accordance with the present invention for converting solar or other photon energy P into electrical energy extracted from the solar cell in the form of electrical current, referred to as a photo-current I. The solar cell embodiments of the present invention may be constructed using conventional solar cell fabrication technology, along with conventional integrated circuit fabrication technology. Referring to FIG. 2, the solar cell 10 includes a substantially neutral base layer 12 which may be of an intrinsic semiconductor material, that is, one which is pure or undoped and has an equal number of holes and electrons. However, in a preferred embodiment, the base layer 12 is an extrinsic semiconductor which is lightly doped with a first 31 conductivity type dopant, such as a P-type dopant to form a $P^{(-)}$ region, that is, one having a slight excess number of holes (positive charge carriers). The concepts and methods of lightly and heavily doping semiconductor materials are known to those skilled in the art of semiconductor doping.

The base layer has opposing first and second surfaces, here, oriented with the first surface as an incident surface 14, and the second surface as a collection surface 16. In operation, the solar cell 10 is positioned with the incident surface 14 directed toward the source of photons P. The incident surface 14 of solar cell 10 has at least one recessed incident contact region 18, with two such contact regions 18 being shown in FIG. 2. The incident surface also has a biasing region 20 adjacent to and surrounding the contact regions 18.

A heavily doped collection layer 22 lies adjacent the base layer collection surface 16. The collection layer 22 is of an extrinsic semiconductor doped to have the fist conductivity type that is, P-doped to provide a P+ region. The collection layer 22 is sandwiched between the base layer 12 and a collector plate or electrode 24 of a conductive material. The collector electrode 24 may be a conventional collector plate or grid. The photo-current I generated by the solar cell 10 is collected by the collector electrode 24 and delivered to an electrical load or a storage device, such as a battery bank (not shown).

A heavily doped incident layer 26 lies adjacent the base layer incident surface 14 and is substantially confined within the incident contact regions 18. The incident layer 26 is of an extrinsic semiconductor doped to have a second conductivity type opposite the first conductivity type. Thus, the illustrated incident layer 26 N-doped to provide an N+ region having an excess number of electrons (negative charge carriers). The interface of the N+ incident layer 26 with the $P^{(-)}$ base layer 12 provides a P-N junction within the solar cell, substantially defined by the walls of the recessed contact regions 18. Furthermore, the $N+P^{(-)}P+$ sandwiching of the respective layers 26, 12 and 22 provides what is known as a complementary cell structure.

To complete a current path through the solar cell 10 for the generated photo-current I, an incident electrode strip or contact 28 of a conductive material is electrically coupled to the incident layer 26 to provide an ohmic contact region. The electrode 28 may be electrically coupled to the incident layer 26 in a conventional manner so that layer 26 is sandwiched between the base layer 12 and electrode 28. A load conductor 30, illustrated schematically in FIGS. 1 and 2, completes the return path for the photo-current I from the electrical load or battery bank (not shown) to the incident electrode 28.

The efficiency of the solar cell 10 is increased over that of the earlier known solar cells by including means for applying an external electric field to the solar cell. This means for applying an external electric field may be an enhancement layer 32 adjacent the base layer incident biasing region 20. In one embodiment, the enhancement layer 32 may comprise a layered metal oxide semiconductor (MOS) structure having an insulating dielectric layer 34, such as an oxide layer, overlaying the biasing region 20 and a portion of the incident layer 26. Such a MOS structure also includes a conductive layer 36, such as a metallic layer, overlaying the dielectric layer 34. For example, if the base layer 12 is of a silicon semiconductor material, the dielectric layer 34 may be of silicon dioxide ($SiO_2$). In a preferred embodiment, the conductive layer 36 is a transparent conductive film, such as of cassiterite ($SnO_2$) or of a lead-tin oxide alloy.

The enhancement layer 32 is electrically coupled to a positive voltage source (not shown) by a bias conductor 38 (illustrated schematically in FIGS. 1 and 2) to provide a positive bias (+) to the enhancement layer. The positive bias of enhancement layer 32 for the illustrated $N+P(-)P+$ solar cell 10 enhances the movement of charge carriers from the lightly doped base layer to at least one of the heavily doped collection and incident layers. The enhancement layer 32 provides an enhanced depletion region 40 in the base layer 12 and the incident layer 26, as defined by the dashed lines 40a, 40b and 40c in FIG. 2, which is larger than the depletion region in conventional solar cells.

In a depletion region, the number of positive carrier holes substantially equals the number of negative carrier electrons. In effect, the influence of the excess charge carriers provided by doping the semiconductor is negated or depleted by the presence of charge carriers having the opposite polarity within the depletion region. Biasing the enhancement layer 32 to apply an externally generated electric field to the semiconductor draws more charge carriers into the depletion region than that experienced in a conventional solar cell. The enhanced depletion region 40 formed around the P-N junction when photon radiation impinges on the semiconductor enhances the operating efficiency of the solar cell 10 as described further below.

One possible arrangement of the enhancement layer 32 with the incident electrode strips 28 is shown in FIG. 1. For example, using the MOS structure embodiment, the enhancement layer 32 may be configured as an enhancement grid 42, and the incident electrode strips 28 as an incident electrode grid 44. The very high resistance to current flow of the enhancement grid 42 electrically isolates grid 42 from the incident electrode grid 44. The incident electrode strips 28 are all electrically coupled together by a photo-current bus bar 46. The load conductor 30 couples the bus bar 46 to the load or battery bank (not shown) receiving the photo-current I from the collector electrode 24. Similarly, the portions of the enhancement grid 42 are all electrically coupled together by an incident enhancement bus bar 48. The enhancement bus bar 48 is electrically coupled to a positive biasing voltage source (not shown) by the bias conductor 38.

As previously mentioned, fabrication of the enhancement grid 42 may be accomplished by using established LSI (large scale integrated) fabrication technology, such as that used to fabricate MOS transistors. For example, a typical solar cell 10 may be fabricated as a four inch diameter wafer, although diameters from one-half inch up to six inches are feasible with current technology. A four inch diameter wafer may have an overall thickness of 450 microns, with the base layer 12 having a thickness of 300–400 microns. Such a four inch diameter wafer may have many thousands of incident electrode strips 28, all electrically coupled together with one or more photo-current bus bars 46. Similarly, the enhancement layer 32 of grid 42 may comprise thousands of portions interspersed between the electrode strips 28, with all of the enhancement layer portions being electrically coupled together with at least one enhancement bus bar 48.

In a conventional solar cell having similar thickness dimensions, assuming no degradation due to radiation (that is due to gamma ray radiation for space applications which would degrade the carrier lifetime), such a solar cell has a minority carrier diffusion length on the order of 160 microns. The term "carrier lifetime" refers to the time during which a charge carrier, either an electron or a hole, travels before it recombines with an opposite charge carrier in the semiconductor matrix. The term "diffusion length" refers to the distance which the charge carrier travels during the carrier lifetime. This carrier lifetime depends upon the diffusivity of the material through which the charge carrier is traveling, as well as the electrical forces within the material. Thus, the solar cell efficiency may be improved if the charge carrier is collected at the collector electrode 24 before recombination occurs, so the collected charge carrier can contribute to the photo-current output of the cell. This improvement is realized by operating solar cell 10 as described below.

In operation, using the MOS structure embodiment for example, a positive polarity bias is applied to the enhancement grid 42 by the biasing conductor 38 to provide an external electric field within the base layer 12. Subjecting the grid 42 to a positive potential creates an enhanced depletion region 40 which is thicker than the depletion region surrounding a conventional solar cell P-N junction. When the solar cell 10 is exposed to the sun or another photon source, the photons P impinging on the solar cell create electron-hole pairs in the depletion region 40.

The enhanced depletion region 40 attracts a larger number of electrons than in conventional solar cells, and many more electrons are directed toward the P+ collector layer 22. Thus, the larger depletion region 40 enhances the photo-current I and improves the overall efficiency of solar cell 10 over that of conventional solar cells.

In this manner, the positively biased enhancement layer 32 increases the number of negative charge carriers flowing from the radiated side of the solar cell to the collector electrode 24, over that of conventional solar cells. This field-induced effect advantageously provides a solar cell 10 having a higher efficiency that other known solar cells. This increased efficiency is expected because the solar spectrum contains considerably more energy in the range where absorption occurs within the base layer 12. The range of absorption refers to the solar spectral range, with specifically, the AM0 and AM2 solar spectrums being of interest here. The AM0 spectrum concerns the solar irradiance in an outer space environment, whereas the AM2 spectrum concerns the solar irradiance on the earth's surface for average weather, atmospheric and environmental conditions. Increasing the range of absorption in both the AM0 and AM2 solar spectrums is particularly advantageous since the solar cell of the present invention may be used in both earth and outer space environments.

The external electric field provided by the enhancement layer 32 is expected to increase the spectral response, that is, the output voltage for all photon wavelengths received by the solar cell, by approximately 25% over that of conventional solar cells. This increase in spectral response translates to an approximate 20% increase in the short circuit current rating of the solar cell of the present invention over the rating of other known solar cells.

The external electric field provided by the enhancement layer 32 also minimizes or virtually eliminates recombination-induced degradation of the solar cell 10. The surface recombination velocity under the enhancement layer 32 is much smaller than that within the incident layer 26. For example, the surface recombination velocity within the N+ layer 26 may be on the order of $10^6$ cm/sec, whereas in the depletion zone 40 beneath the enhancement layer 32, the velocity may be on the order of 100 cm/sec. Thus, by confining the incident layer 26 within the base cell contact region 18, the recombination of charge carriers in the N+ region is advantageously reduced. Specifically, this confinement reduces the horizontal diffusion and recombination of the charge carriers within the incident N+ layer 26. This results in better performance and significantly improves the stability, reliability and overall lifetime of the solar cell 10.

Use of the optional transparent conductive film for the conductive layer 36 also improves the efficiency of the solar cell 10. The transparent conductive film 36 prevents loss of the photons P in the enhancement layer 32 because there is no internal absorption or reflection, such as would be experienced using an opaque metal for the conductive layer 36. In the illustrated embodiment, all of the photons received by the transparent conductive layer 36 pass therethrough to the oxide layer 34. Furthermore, some of the photons P are influenced in the N+ incident region by the transparent coating 36. The transparent layer increases the probability that more photons impacting the solar cell at an acute angle will pass therethrough, rather than being reflected away.

Referring to FIG. 3, an alternate embodiment of an advanced solar cell 10' constructed in accordance with the present invention is illustrated for converting photon energy P into photo-current I. The solar cell 10' has a substantially neutral base layer 50 which may be of an intrinsic semiconductor material. However, preferably the base layer 50 is lightly doped as described above for base layer 12 with a first conductivity type, such as a P-type doping to form a P(−) region. The base layer 50 has opposing first and second surfaces, here, oriented as respective incident and collection surfaces 52 and 54.

The collection surface 54 has at least one recessed collection contact region 56 and an adjacent collection biasing region 58.

A heavily doped incident layer 60 lies adjacent the base layer incident surface 52. In the illustrated embodiment, the incident 60 is of an extrinsic semiconductor of a second conductivity type, opposite to the first conductivity type, here, being doped to provide an N+ region. The interface of the N incident layer 60 with the P(−) base layer 50 provides a P-N junction substantially defined by the base layer incident surface 52. The incident layer 60 is sandwiched between the base layer 50 and an anti-reflection coating layer 62. A conventional anti-reflection coating may be used. Alternatively, the coating layer 62 may be a transparent conductive film, such as that described above for the conductive layer 36.

To promote photo-current flow through the solar cell 10', a conventional incident side electrode grid having at least one electrode strip or contact 64 may be used to provide an ohmic contact region. The illustrated incident side grid has plural electrode strips 64, each electrically coupled to the incident layer 60 and embedded within the coating layer 62. All of the electrode strips 64 are electrically coupled together as schematically illustrated in FIG. 3 by the incident photo-current conductor 66.

The solar cell 10' has a heavily doped collection layer 70 of the first conductivity type, illustrated as a P+ region. The collection layer 70 lies adjacent the base layer collection surface 54, and is substantially confined within the collection contact regions 56. The illustrated N+P(−)P+ sandwiching of the respective layers 60, 50 and 70 provides a complementary cell structure. A collection electrode strip or contact 72 of a conductive material is electrically coupled to the collection layer 70 to provide an ohmic contact region for gathering the photo-current I generated by solar cell 10'. The electrode strip 72 may be electrically coupled to the collection layer 70 in a conventional manner with layer 70 sandwiched between the base layer 50 and electrode 72.

A load conductor 74, illustrated schematically in FIG. 3, electrically couples together each of the plural electrode strips 72. The load conductor 74 also delivers o the generated photo-current I from the solar cell 10' to a load or storage device (not shown). For the illustrated embodiment, the plurality of collector contact regions 56 may be arranged in the base layer 50 to form a collector electrode grid (not shown), which may be similar to the incident electrode grid 44 illustrated in FIG. 1.

The efficiency of the solar cell 10' is increased over that of the earlier known solar cells by including means for applying an external electric field to the solar cell. This means for applying an external electric field may be an enhancement layer 76 adjacent the base layer collection biasing region 58. In one embodiment, the enhancement layer 76 may comprise a layered MOS structure having an insulating dielectric layer 78, such as an oxide layer, overlaying the collection biasing region 58 and a portion of the collection layer 70. The MOS structure also has a conductive layer 80 of a conductive material overlaying the dielectric layer 78. A bias conductor 82 is electrically coupled to the conductive layer 80. The arrangement of the enhancement layer 76 of solar cell 10' may be similar to that of the enhancement grid 42 illustrated in FIG. 1.

In an alternate embodiment, the collection enhancement layer 76 may also be a polysilicon gate or an evaporated metal gate, each of which may be fabricated using conventional fabrication techniques. Note, that there is no on/off gating-type, function performed by the enhancement layer. Rather, the term "gate" is used herein to convey the idea of a structure similar to these known gates, with this structure functioning as an enhancement layer.

The solar cell 10' may be doped to operate under near-avalanche conditions, that is, near the break down limit of the $N^+P^{(-)}$ junction, when the enhancement layer 76 is appropriately biased. Establishment of the near-avalanche operating conditions may be empirically determined depending upon the type of semiconductors used. For example, by carefully controlling the doping within the base layer 50, the negative bias supplied to the enhancement layer by conductor 82 may be adjusted to achieve this efficient near-avalanche operation.

In operation, the enhancement layer 76 is negatively biased with a negative voltage applied by conductor 82 to operate the enhancement layer in an enhancement mode. The enhancement mode provides a depletion region 84 within the base layer 50 and the incident layer 60, as defined by the dashed lines 84a and 84b The enhanced depletion region 84, that is, enhanced over that of a conventional solar cell, operates in the manner described above for depletion layer 40 of the FIG. 2 embodiment to promote solar cell efficiency.

For example, the enhanced depletion region 84 allows the collection of more charge carriers even when the carrier lifetime is reduced. This advantageously improves the efficiency of the solar cell 10' over that of conventional solar cells. Furthermore, the confinement of the P+ collection layer 70 within the base layer contact regions 56 minimizes the loss of carriers due to horizontal recombination, such as that suffered by conventional solar cells. Thus, the confinement of the collection layer further serves to improve the efficiency of solar cell 10'.

Referring to FIG. 4, a third embodiment of an advanced solar cell 10" constructed in accordance with the present invention is illustrated for converting solar or other photon energy P into photo-current I. The solar cell 10" has a substantially neutral base layer 90 which may be of an intrinsic semiconductor material, but is preferably of a lightly doped extrinsic semiconductor. The illustrated embodiment is a complementary cell structure wherein the first conductivity type is chosen as P-type such that the base layer 90 formed of a $P^{(-)}$ region.

The base layer 90 has opposing first and second surfaces, with the first surface oriented as an incident surface 92. The incident surface 92 has a recessed incident contact region 94 and an adjoining incident biasing region 96. The second surface of the base layer 90 is a collection surface 98 having a recessed collection contact region 100 and an adjoining collection biasing region 102. Preferably, the base layer 90 has a plurality of incident and collection contact regions 94 and 100.

A heavily doped incident layer 104 of a second conductivity type, here doped to provide an N+ region, is substantially confined within the incident contact regions 94. The interface of the N+ incident layer 104 with the $P^{(-)}$ base layer 50 provides a P-N junction within the solar cell 10" which is substantially defined by the walls of the recessed incident contact regions 94.

An incident electrode strip or contact 106 is electrically coupled to the incident layer 104 to provide an ohmic contact region, and may be configured like the incident electrode grid 44 of FIG. 1. A load conductor 108, illustrated schematically in FIG. 4, is electrically coupled to the electrode strip 106. The conductor 108 provides a return circuit path from a load or storage device (not shown) powered by the electrical energy generated by solar cell 10".

The solar cell 10" has means for applying an external electric field to the solar cell, including an incident enhancement layer 110 lying adjacent the base layer incident biasing region 96. The enhancement layer 110 may be configured like the enhancement grid 42 shown in FIG. 1. In one embodiment, the enhancement layer 110 comprises a layered MOS structure having a dielectric layer 112, such as an oxide layer, overlaying the incident biasing region 96 and a portion of the incident layer 104. The enhancement layer 110 also includes a conductive layer 114 overlaying the dielectric layer 112. A positive bias may be applied to the conductive layer 114 via a bias conduit 116 to operate the MOS structure in an enhancement mode.

The solar cell 10" means for applying an external electric field to the solar cell, also includes, a heavily doped collection layer 120 of the first conductivity type, here doped to provide a P+ region. The collection layer 120 is substantially confined within the collection contact regions 100 of base layer 90. A collection electrode strip or contact 122 is electrically coupled with the collection layer 120 to provide an ohmic contact region. The electrode 122 coupled the collection layer 120 to the load or storage device via a load conductor 123, illustrated schematically in FIG. 4. The plural collection electrodes 122 may be configured like the incident electrode grid 44 of FIG. 1.

The solar cell 10" also has a collection enhancement layer 124 adjacent the collection biasing region 102 of base layer 90. The enhancement layer 124 may be configured like the enhancement grid 42 shown in FIG. 1. In one embodiment, the collection enhancement layer 124 may be a layered MOS structure having an insulating dielectric layer 126, such as an oxide layer, overlaying the collection biasing region 102 and a portion of the collection layer 120. The MOS structure embodiment also has a conductive layer 128 overlaying the dielectric layer 126. This MOS structure embodiment may be as described above with respect to the embodiment of FIG. 3. In an alternate embodiment, the collection enhancement layer 124 may be a polysilicon gate or an evaporated metal gate, as described above for enhancement layer 76 for solar cell 10' of FIG. 3.

In operation, the enhancement layers 110 and 124 are biased for operation in an enhancement mode. A negative bias is applied via conductor 130 to the collection enhancement layer 124. This provides a collection depletion region 132, defined by dashed line 132a, in the base layer 90 between adjacent collection regions 100. A positive bias is applied to the incident enhancement layer 110 via conductor 116 to provide an incident depletion layer 134 within the base layer 90 and the incident layer 104. The incident depletion region is defined by dashed lines 134a, 134b and 134c. The depletion regions 132 and 134 enhance the solar cell efficiency as described above by allowing more carriers to be collected before recombination than that experienced using conventional solar cells. Fabrication of the solar cell 10" of FIG. 4 may be accomplished using conventional double-sided wafer processing, which may be more economical in some applications than in others.

Having illustrated and described the principles of our invention with respect to several preferred embodiments, it should be apparent to those skilled in the art that our invention may be modified in arrangement and detail without departing from such principles. For example, other semiconductors such as germanium, may be employed, as well as other suitable enhancement layers for applying and external field to the solar cell. Furthermore, while a complementary solar cell structure having N+P(−)P+ regions is illustrated, a solar cell having P+N−N+ regions may also be used with the enhancement layers being biased opposite to that described above. Other arrangements of the collection and incident contact regions are also possible, such as a relative staggering of the illustrated opposing collection and incident contact regions shown in FIG. 4. We claim all such modifications falling within the scope and spirit of the following claims.

We claim:

1. A photovoltaic cell comprising:
   a layered extrinsic semiconductor having a substantially neutral base layer sandwiched between two heavily doped layers having opposite conductivity types to form a P-N junction within the semiconductor; and
   means for applying an externally generated electric field to the semiconductor to enhance a depletion region formed around the P-N junction to extend into the base layer when photo radiation impinges on the semiconductor.

2. A photovoltaic cell according to claim 1 wherein the semiconductor comprises a lightly doped base layer of a first conductivity type having opposing incident and collection surfaces, one of which has a recessed contact region adjoining a biasing region, and one of the two heavily doped layer comprises a collection layer of the first conductivity type of adjacent the base layer collection surface, and the other of the two heavily doped layers comprises an incident layer of a second conductivity type lying adjacent the base layer collection surface, with one of the collection and incident layers being substantially confined within the base layer contact region.

3. A photovoltaic cell according to claim 2 wherein the cell further includes a conductive electrode overlying the contact region and being electrically coupled to the one of the collection and incident layers substantially confined within the contact region for providing a path for photo-current generated by the cell when photon radiation impinges on the semiconductor.

4. A photovoltaic cell according to claim 2 wherein the means for applying an externally generated electric field to the semiconductor comprises an enhancement layer adjacent the base layer biasing region.

5. A solar cell comprising:
   a lightly doped base layer of semiconductor material in which solar energy generates charge carriers, the base layer being of a first conductivity type having opposing incident and collection surfaces with at least one of said surfaces having a contact region and biasing region;
   a heavily doped collection layer of the first conductivity type adjacent the base layer collection surface;
   a heavily doped incident layer of a second conductivity type opposite the first conductivity type, adjacent the base layer incident surface;
   at least one of the collection and incident layers being substantially confined to the base layer contact region; and
   an enhancement layer adjacent the base layer biasing region biased for enhancing movement of charge carriers from the lightly doped base layer to at least one of the heavily doped collection and incident layers.

6. A solar cell according to claim 5 wherein the base layer contact region is recessed relative to the biasing region, and at least one of the collection and incident layers is substantially confined within the recessed contact region.

7. A solar cell according to claim 6, further including a conductive electrode overlaying the contact region and being electrically coupled to one of the collection and incident layers substantially confined within the contact region for providing a path for photo-current generated by the cell when photon radiation impinges on the semiconductor.

8. A solar cell according to claim 5 wherein the enhancement layer comprises a layered metal oxide semiconductor (MOS) structure having a dielectric layer adjacent the base layer biasing region and a conductive layer overlying the dielectric layer.

9. A solar cell according to claim 5 wherein the conductive layer comprises a transparent conductive film.

10. A solar cell according to claim 7 wherein the transparent conductive film is of a lead-tin oxide composition.

11. A solar cell according to claim 5 wherein the first conductivity type is positive and the second conductivity type is negative.

12. A solar cell according to claim 5 wherein the base layer incident surface has the contact and biasing regions.

13. A solar cell according to claim 5 wherein the collection surface has the contact and biasing regions.

14. A solar cell according to claim 13 wherein the base layer has a doping level sufficient to support near avalanche condition operation at an interface of the base layer and the collection layer when the enhancing layer is sufficiently biased to induce avalanche operation.

15. A solar cell according to claim 13 wherein the enhancing layer lines adjacent the collection surface biasing region, and the enhancing layer comprises a polysilicon gate.

16. A solar cell according to claim 13 wherein the enhancing layer lies adjacent the collection surface biasing region, and the enhancing layer comprises an evaporated metal gate.

17. A solar cell according to claim 5 wherein:
   the incident surface has an incident contact region and an incident biasing region;
   the collection surface has a collection contact region and a collection biasing region;
   the incident layer is substantially confined within the incident contact region;
   the collection layer is substantially confined within the collection contact region;
   the enhancing layer comprises an incident enhancing layer adjacent the incident biasing region; and
   the solar cell further includes a collection enhancing layer adjacent the collection biasing region.

18. A method of converting solar energy into electrical energy, comprising the steps of:
provided a layered extrinsic semiconductor in which solar energy generates charge carriers, the semiconductor having a substantially neutral base layer sandwiched between two heavily doped layers of opposite conductivity types to form a P-N junction within the semiconductor;
irradiating the semiconductor with solar energy in the form of solar photon radiation; and
applying an externally generated electric field to the semiconductor to enhance a depletion region formed around the P-N junction when photon radiation impinges on the semiconductor and to enhance the movement of charge carriers from the base layer to one of the heavily doped layers.

19. A method according to claim 18 wherein:
the providing step comprises the step of providing a semiconductor having an enhancement layer adjacent a portion of at least one of the two heavily doped layers; and
the applying step comprises the step of biasing the enhancement layer with a voltage to provide the externally generated electric field to the semiconductor.

20. A method according to claim 18 wherein:
the providing step comprises the step of providing a semiconductor having a first enhancement layer adjacent a portion of one of the two heavily doped layers and a second enhancement layer adjacent a portion of the other of the two heavily doped layers; and
the applying step comprises the steps of biasing the first enhancement layer with a voltage opposite in polarity to that of the heavily doped layer adjacent the first enhancement layer, and biasing the second enhancement layer with a voltage opposite in polarity to that of the heavily doped layer adjacent the second enhancement layer, to provide the externally generated electric field to the semiconductor.

* * * * *